(12) United States Patent
Avramescu et al.

(10) Patent No.: US 12,713,737 B2
(45) Date of Patent: Aug. 18, 2026

(54) METHOD OF MANUFACTURING A SEMICONDUCTOR BODY AND SEMICONDUCTOR DEVICE

(71) Applicant: ams-OSRAM International GmbH, Regensburg (DE)

(72) Inventors: Adrian Avramescu, Regensburg (DE); Norwin von Malm, Thumhausen/Nittendorf (DE); Peter Stauss, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 517 days.

(21) Appl. No.: 18/251,160

(22) PCT Filed: Oct. 29, 2021

(86) PCT No.: PCT/EP2021/080087

§ 371 (c)(1), (2) Date: Apr. 28, 2023

(87) PCT Pub. No.: WO2022/090446

PCT Pub. Date: May 5, 2022

(65) Prior Publication Data

US 2023/0411556 A1 Dec. 21, 2023

(30) Foreign Application Priority Data

Oct. 30, 2020 (DE) ......................... 102020128680.5

(51) Int. Cl.
*H10H 20/812* (2025.01)
*H10H 20/01* (2025.01)
(Continued)

(52) U.S. Cl.
CPC .......... *H10H 20/812* (2025.01); *H10H 20/01* (2025.01); *H10H 20/01335* (2025.01);
(Continued)

(58) Field of Classification Search
None
See application file for complete search history.

(56) References Cited

U.S. PATENT DOCUMENTS

| | | | |
|---|---|---|---|
| 11,043,792 | B2 | 6/2021 | Han et al. |
| 2009/0001416 | A1 | 1/2009 | Chua et al. |

(Continued)

FOREIGN PATENT DOCUMENTS

| | | | |
|---|---|---|---|
| EP | 2731149 | A1 | 5/2014 |
| JP | 2001077413 | A | 3/2001 |

(Continued)

*Primary Examiner* — Alexander G Ghyka
(74) *Attorney, Agent, or Firm* — Slater Matsil, LLP

(57) ABSTRACT

In an embodiment a method for manufacturing a semiconductor body includes providing an subcarrier, generating a layer sequence with a first layer having a doped semiconductor material and a second layer deposited thereon, the second layer having an undoped semiconductor material, providing an electrochemical porosification of the first layer, wherein a degree of porosity is at least 20% by volume, forming mesa structures in the second layer and at least partially in the porous first layer and epitaxially producing a functional layer sequence having at least one planar third layer which is applied to the second layer comprising the mesa structures, wherein the at least one planar third layer has a specific lattice constant which is different from a lattice constant of the second layer.

9 Claims, 6 Drawing Sheets

(51) Int. Cl.

| | |
|---|---|
| ***H10H 20/817*** | (2025.01) |
| ***H10H 20/819*** | (2025.01) |
| ***H10H 20/825*** | (2025.01) |

(52) U.S. Cl.

CPC ........ *H10H 20/817* (2025.01); *H10H 20/819* (2025.01); *H10H 20/825* (2025.01)

(56) References Cited

U.S. PATENT DOCUMENTS

| | | | |
|---|---|---|---|
| 2017/0237234 | A1 | 8/2017 | Han et al. |
| 2019/0214529 | A1 | 7/2019 | Ahmed |
| 2020/0227255 | A1 | 7/2020 | Zhu et al. |

FOREIGN PATENT DOCUMENTS

| | | | |
|---|---|---|---|
| JP | 2005057220 | A | 3/2005 |
| JP | 2008177563 | A | 7/2008 |
| JP | 2018502436 | A | 1/2018 |
| WO | 2010112980 | A1 | 10/2010 |
| WO | 2012065536 | A1 | 5/2012 |

3
3b
2"
2'
1

3b
20
1

8
3
3a
2
1
4
S3
S4
2c
2b
8a
S5

METHOD OF MANUFACTURING A SEMICONDUCTOR BODY AND SEMICONDUCTOR DEVICE

CROSS-REFERENCE TO RELATED APPLICATIONS

This patent application is a national phase filing under section 371 of PCT/EP2021/080087, filed Oct. 29, 2021, which claims the priority of German patent application 10 2020 128 680.5, filed Oct. 30, 2020, each of which is incorporated herein by reference in its entirety.

TECHNICAL FIELD

The present invention relates to a method of manufacturing a semiconductor body, in particular an optoelectronic device. The invention also relates to a semiconductor device, in particular an optoelectronic component.

BACKGROUND

In the production of semiconductor devices, different or at least modified material systems are often used to generate the necessary functionality. These material systems can have a different lattice constant, i.e. the atoms in their lattice structure have different distances in the respective material system. In addition to the lattice spacing, electrical properties also change. A well-known illustration showing the relationship between band gap and lattice constant can be found at the following address: https://de.wikipedia.org/wiki/III-V-Verbindungshalbleiter#/media/Datei:III-V-Halbleiter.png. It shows the band gap plotted versus the lattice constant in a wurtzite as well as a zincblende structure. The lines between the elements represent the ternary compounds. The wurtzite crystallization comprises 2 lattice constants a and c, the zincblende only one.

In optoelectronic devices, for example, the growth of InGaN quantum wells emitting at wavelengths longer than 600 nm causes difficulties due to the increased indium content (more than 30%). This is due to the increased lattice spacing, which increases with increasing In content. Such InGaN-rich alloys have a large lattice.

The different lattice constants generally lead to a constant mismatch with the underlying GaN layers when depositing such a material on a GaN buffer layer, which implies a higher defect density and/or phase separation with different In concentrations.

A similar problem also arises in the case of InGaAIP devices with better temperature stability and/or better efficiency. In this material system, the growth of carrier-limiting barriers on both sides of a multiple quantum well would be favored for light generation, a direct bandgap material with a larger bandgap. However, such a material would exhibit significant lattice mismatch with the GaAs substrate and cannot be grown with good crystalline quality.

Thus, in general, the growth of specific compound semiconductors with a high lattice constant mismatch to the underlying layers is difficult when high crystalline quality is required.

To avoid or at least reduce these problems, for example, very thick, gradually matched buffers, lattice relaxation by defect induction, small patterning and masking with dielectric masks are used. However, thick layers, for example, or gradually matched buffer layers are disadvantageous in their electrical properties in some applications. In addition, the manufacturing effort and the control of the manufacturing conditions are increased.

SUMMARY

Embodiments provide a method in which the holding force between the sapphire substrate and the layers that are part of the device is reduced. This reduces the effect of different lattice constants due to different material systems. In particular, strain can be reduced, allowing epitaxial growth even with little adjustment of lattice constants. This is achieved by modifying individual layers using an electrochemical porosification process.

Embodiments provide a method for manufacturing a semiconductor body, which in a first step provides for the provision of a subcarrier. Subsequently, a layer sequence comprising a first layer with a doped semiconductor material, in particular a III-V semiconductor material, and a second layer with an undoped semiconductor material is deposited on the first layer. The first layer is electrochemically porosified in a following step, wherein a porosity degree is at least 20 volume-%.

Further embodiments provide an optional formation of mesa structures in the porous first layer and in the second layer. Subsequently, a functional layer sequence is generated on the second layer. For this purpose, the functional layer sequence has at least one planar third layer which is applied to the second layer provided with mesa structures, the at least one planar third layer comprising a specific lattice constant which is different from that of the second layer. Likewise, a degree of porosity can be between 50 volume-% and 90 volume-%.

Through porosification, intermediate or hollow spaces are inserted into the structure of the first layer. These voids allow to compensate for distortions without defects occurring in increased numbers in a layer deposited on this porosified layer. In other words, porosification can compensate for strains due to different lattice constants in such a way that no lattice effects occur. By means of an optional additional mesa structure, this effect is further enhanced. In some material systems, mesa structuring with porosification of the first layer is particularly suitable for compensating even larger differences in the lattice constant.

In this context, a lattice constant is understood to be the length of a unit cell in a defined material system. The material system is uniform and contains no defects or lattice defects. It is therefore unstrained. The lattice constant is a characteristic value for each material system and is also referred to as the specific lattice constant in relation to the unstrained material system. Different material systems can therefore have different specific lattice constants, as shown in the link above. Therefore, if material systems with different lattice constants are brought together, a strain will occur in a boundary region of these systems, i.e. the lattice constants will change. This change decreases with increasing distance to the boundary region. In addition, if the differences in the lattice constants are too large, defects or imperfections may occur. The proposed method and also the embodiments according to the invention allow this effect to be exploited in a targeted manner.

In the following, a functional semiconductor layer sequence or a functional semiconductor body refers to a layer sequence which is structured in such a way that it can assume an electrical function as a finished component. In this case, a functional semiconductor layer sequence can be separated, with each individual element then having the desired functionality. An example of a functional semiconductor layer sequence would be a layer sequence that has, for example, a region suitable for light emission. Another example would be an npn junction, which has a transistor function. The layer sequence can also combine several functions.

A subcarrier is a carrier made of an inert material which serves as a basis for subsequent processes, in particular an epitaxial deposition of semiconductor materials. A material for a subcarrier is, for example, sapphire ($Al_2O_3$), but also silicon nitride or another material. It may be convenient for the material to be inert to various etching processes used in semiconductor device fabrication. In some cases, the subcarrier remains attached to and becomes part of the device, in which case the subcarrier is also referred to simplistically as the carrier substrate. In other cases, there is a detachment (as explained below) of a device fabricated on the subcarrier.

A semiconductor material is generally understood to be an undoped compound semiconductor material, unless this is explicitly mentioned otherwise. The term “undoped” in this case means that a dedicated, conscious and intentional doping with another element or material is not carried out. Defects or impurities, which are always present in practice, do not fall under doping in the sense of this application. A compound semiconductor material is a combination of two, 3 or more elements created in a crystal structure such that a band structure is formed and the resulting element exhibits electrical semiconductor properties. A typical compound semiconductor is a so-called III-V compound semiconductor, which consists of one or more elements of the fifth main group and one or more elements of the third main group. Examples of compound semiconductor materials include GaAs, AlGaAs, GaN, AlGaN, InGaN, GaP, InGaP, AlGaP, AlInGaN, AlInGaP, and others mentioned herein.

A doped semiconductor is a semiconductor material into which a dopant is introduced. The dopant may be Si, Te, Se, Ge or Ge for n-doping and, for example, Mg, Be or C for p-doping, depending on the desired doping in a III-V compound semiconductor. Other dopants are listed in this application. The dopant is introduced during an epitaxial deposition of the III-V compound semiconductor material, but doping can also be performed subsequently by various methods. The dopant concentration is several orders of magnitude lower than the concentration of atoms of the starting or base material. For example, the concentration is in the range of $1*10^{17}$ doping atoms/$cm^3$ to $5*10^{21}$ doping atoms/$cm^3$.

Electrochemical decomposition or electrochemical etching is a process in which an electrical voltage and current are used to dissolve a semiconductor material. This allows a layer of a semiconductor material to be dissolved or etched. However, this process does not take place uniformly, but unevenly, e.g. due to dislocations or material defects. This can be exploited with a suitable choice of parameters, e.g. applied voltage and concentration of a dopant as well as the semiconductor material to be etched. For example, a different velocity and also porosity of the material to be etched can be achieved. The term electrochemical porosification thus refers to an electrochemical process that selectively removes material from a body, leaving behind a porous or sponge-like structure. A porosified semiconductor body or layer thus produces a reticular structure similar to a sponge or a bone, which comprises sufficient stability while maintaining a low mass or volume of material.

A layer can be subjected to a selective porosification method in which a structured mask is applied before the method. This reduces or prevents current flow in areas of the layer due to so-called shading, so that no or only very little porosification takes place in areas over which a mask is placed. Accordingly, a nonporous semiconductor body does not exhibit a reticulated or sponge-like structure, although it may nevertheless exhibit various defects or lattice defects. In addition, in some embodiments, effects may occur in the boundary region in which a portion of an intrinsically non-porous region exhibits a small amount of porosification, particularly at the edges of such a region, with the so-called degree of porosity (see further below) decreasing with increasing distance from the edges.

In the case of a non-porous area, penetration of an electrolyte under the shadowed areas during the electrochemical etching process is impeded or also prevented, so that no further etching channels can form there, or existing channels are not widened by the electrolyte. As a result, the removal rate under the shadowed areas is significantly lower, so that the material is porosified there to a much lesser extent or not at all.

The term porosity grade describes the ratio of material volume to the total volume of the layer. A porosity grade in the range of 30% thus means that 30% material has been removed compared to the original volume. At a porosity level of 90%, 90% of the material has been removed by the electrochemical porosification process and only 10% of the material remains.

After a fabrication of the functional semiconductor layer sequence, in some aspects, the functional layer sequence is provided to be detached from the first layer, optionally leaving the second layer on the functional layer sequence. Alternatively, the functional layer sequence may be detached from the subcarrier such that the porosified first layer remains on the functional semiconductor layer sequence and is optionally usable as an outcoupling structure for electromagnetic radiation. In such embodiments, the porosified first layer may also be further processed. For example, contact regions may be deposited thereon.

In some aspects, the mesa structures are formed by applying a patterned mask to the second layer in a first step. Subsequently, the second layer and the porosified first layer are etched to form depressions. In some examples, these are formed as trenches in the porosified first layer.

In some aspects, the mesa structures are formed after porosification of the first layer. However, depending on the material system used, it is probably also possible to form the mesa structures prior to the electrochemical porosification step.

Another aspect deals with the embodiment of the first layer. In some embodiments, the first layer is deposited in partial steps, wherein after the first partial step, the deposition is interrupted and a thin release layer, in particular an undoped release layer is deposited. Subsequently, the epitaxial deposition of the first layer is continued. As a result, the first layer is divided into a region facing the substrate and a region facing away from the substrate. In some aspects, the doping level between the regions of the first layer is also different here, or a different material system for the release layer is possible. Different degrees of porosity can be achieved by creating the first layer with doping levels that vary in areas, and/or thin release layers. Thus, the degree of porosity can be adapted for the whole wafer as well as locally to the needs for growing further layers.

In another aspect, the step of creating further structures in the first layer is provided. In one aspect, the step of creating a layer sequence comprises creating non-porous areas. This is done by applying a patterned mask to the second layer of the layer sequence to create non-porous areas below the patterned mask, and then removing the patterned mask after electrochemically porosifying the first layer. This leaves areas of the first layer below "shadowed" areas, i.e. they are not porosified or only porosified to a very small extent. These areas now exhibit different mechanical and electrical properties. Thus, when the third layer is applied, an area that is not porosified or is only slightly porosified can create stresses in the third layer. In some aspects, this is exploited to form, for example, active regions that emit light at different wavelengths.

Thus, the functional layer sequence can be designed with an active region for emission of light of a first wavelength over a porosified region and an active region for emission of light of a second wavelength over a non-porosified region. The different wavelengths are caused, among other things, by the strains due to different lattice constants over the porosified and non-porosified regions, respectively.

In some aspects, it may be convenient to select dimensions in the patterned mask slightly larger than the area or areas of the first layer below the patterned mask that are not to be porosified. The shading of the mask prevents, or reduces, current flow along and below these regions in the first layer during the electrochemical process. As a result, the material of the first layer remains substantially intact. The slightly larger dimension of the mask also compensates for any slight under-etching that may be present.

In some aspects, a mesa structure can be performed before or after the selective porosification described above. This can also be used to at least partially control porosification. Thus, a combination of structured mask and mesa structuring may be provided so that, after the individual process steps, a structure results in which porosified areas alternate with non-porosified areas of the first layer separated by a trench.

In some embodiments, the depressions, in particular in the form of trenches, have a width in the range from 5 nm to 500 nm, in particular in the range from 20 nm to 300 nm and further in particular less than 200 nm. The trenches can extend up to the subcarrier, but can also end before it, or end there if a release layer is present in the first layer.

In order to be able to accommodate possible stresses due to differences in the lattice constants, the mesa structures formed as trenches or depressions should not be too large, for one thing. The above values have been found to be appropriate in experiments. However, the distance between mesa structures should also not be too large so that tensions caused by the trenches or depressions can be compensated. A suggested spacing between 2 adjacent mesa structures is a range of 400 nm to 4 μm, particularly a range of 800 nm to 2.5 μm, and especially less than 2 μm. In some aspects, a relationship between a width of a mesa structure and a distance between 2 mesa structures may be defined. This may be in the range of 4 to 15, in particular in the range of 8 to 12, and in particular 9.5 to 10.5.

A further aspect relates to a deviation of the lattice constants, in particular between the second layer and the third layer forming part of the functional layer sequence. In this regard, the lattice constant of the planar third layer may deviate from a lattice constant of the second layer by at most 20%, in particular in the range of about 0.4% to 3%, in particular in the range of 0.5% to 2.7%. Materials based on GaN or GaAs can be used as the material of the different layers, which in turn can be doped with Si, C, Ge or even Mg. In particular, the third layer of the functional layer sequence may comprise an indium-containing layer. The layer can also be formed as a superlattice or in turn comprise a layer sequence. The indium content may be in the range from 0.0001% to 25%, for example in the range from 2% to 20%. The layer can also be formed as a superlattice or in turn comprise a layer sequence. Later layers of the second semiconductor layer sequence, in particular those that contribute to optical functionality, may have an indium content of at least 20%, in particular of at least 40%, and in particular in the range of 30% to 60%. In some embodiments, the indium content may be as high as 100%. Alternative base materials are listed above. Doping can be performed during epitaxial deposition. This also allows the doping concentration to be continuously adjusted.

In one embodiment, the second layer has undoped GaN and the planar third layer has an indium-containing material, for example InGaN. The indium portion of the first layer is formed of doped GaN, with the dopant concentration ranging from $1*10^{17}$ atoms/cm$^3$ to $5*10^{21}$ atoms/cm$^3$.

The inventors have recognized that the alignment of the crystal structure, especially in mesa patterning is a relevant factor to further reduce the defect density and to obtain a smooth surface during the deposition and growth processes. Therefore, in some aspects, it is proposed to align coalescent surfaces so that they are perpendicular to the a-axis [1120] in materials with a wurtzite structure.

In another aspect, various embodiments of the functional layer sequence are provided. In some embodiments, epitaxially generating a functional layer sequence comprises generating a multiple quantum well structure. This is configured to emit light of a wavelength. In this regard, the multiple quantum well structure may extend over at least one mesa structure. In some aspects, the multiple quantum well structure extends over both porous regions and non-porous regions of the first layer. As a result, a different banding pattern is created in the multiple quantum well structure over the respective regions in the first layer due to the presence of strains. This is achieved because a strain locally changes the lattice constant, so that during a growth process the stoichiometric composition of the grown material changes, which in turn changes the band gap. This effect can be exploited, for example, in indium-containing material systems, since with increasing lattice constant the ratio of Ga/In is shifted toward indium and thus toward longer wavelengths. As a result, light of different wavelengths can be generated.

The inventors have recognized that, contrary to an obvious assumption, when the third layer is deposited on the mesa-structured second layer, material of the third layer just does not get into the trenches, or only very little. In particular, the material of the third layer does not fill these trenches, but forms a bridge over the trenches, leaving a void. At the same time, the mesa structure in combination with the porous first layer compensates for the distortions due to the changed lattice constant.

Another aspect deals with a semiconductor device or body. In some aspects, this comprises a subcarrier and a layer sequence comprising a first layer having a doped semiconductor material and a second layer deposited thereon. The second layer comprises an undoped semiconductor material, wherein the first layer comprises at least one porous region having a porosity level of at least 20% by volume. Furthermore, a mesa structure comprising a plurality of recesses is introduced in the first and second layers. A functional layer sequence with at least one planar third layer is applied to the second layer provided with the mesa structure, the at least one planar third layer having a lattice constant which is different from that of the second layer.

The mesa structure introduced in combination with the porosified first layer reduces or even prevents stress in the third planar layer. As a result, material systems with a different lattice constant can also be used, with the porous modification allowing relaxation of the third layer as well as the functional layer sequence.

In some aspects, the width of the well or even a trench is less than 200 nm, and the distance between two wells is less than 2000 nm. Other dimensions for trenches and the distances between them are given above. In some examples, a width of the well is about a ⅕ to 1/20 of the distance between two adjacent wells.

In some further aspects, the first layer is not porosified throughout. Rather, at least one non-porosified region may be provided that is at least partially surrounded by a porosified region. As a result, various applications are possible. For example, the at least one non-porosified region may be implemented as a support structure for a functional semiconductor body later seated thereon. Likewise, the non-porous region could be used to locally introduce a bias in further layers in a targeted manner and thus realize a change in a band gap or a change in electrical properties.

It may be provided that the at least one non-porous region is separated from the porous region by a trench forming the mesa structure.

Another aspect relates to an embodiment of the functional layer sequence. For example, in some embodiments, the functional layer sequence is formed with a multiple quantum well structure deposited on the third layer. In some aspects, a first region of the multiple quantum well structure overlying a porous region of the first layer is configured to emit light of a first wavelength and a second region of the multiple quantum well structure overlying a non-porous region of the first layer is configured to emit light of a second shorter wavelength.

In some other aspects, the first layer may comprise a first sub-region having a first porosity level and a second sub-region separated by a separation layer having a second porosity level. This can be used to implement different applications that require, for example, locally separated different lattice constants. Also, an additional separation layer can further reduce a defect density in the third layer.

In one embodiment, the first layer comprises n-doping while the second layer is undoped, the first and second layers having the same base material. For example, the second layer may comprise an undoped GaN layer and the third layer may be formed with InGaN having an indium content in the range of 0.0001% to 25%, in particular less than 15%. The third layer can also be formed as a superlattice or in turn comprise a layer sequence. Later layers of the second semiconductor layer sequence, in particular those that contribute to optical functionality, may have an indium content of at least 20%, in particular of at least 40%, and in particular in the range of 30% to 60%. In some embodiments, an indium content of 100% may also be used, especially if the indium layer is designed to be very thin. During an epitaxial growth process, a strain causes a local change in the lattice constant, so that the stoichiometric composition of the grown material changes during a growth process. This allows, for example, the indium content in the grown material system to be varied locally, changing the band gap. This makes it possible to create regions that generate light of different wavelengths in one operation.

BRIEF DESCRIPTION OF THE DRAWINGS

Further aspects and embodiments according to the proposed principle will become apparent with reference to the various embodiments and examples described in detail in connection with the accompanying drawings. Thus showing.

DETAILED DESCRIPTION OF ILLUSTRATIVE EMBODIMENTS

Figure 1:
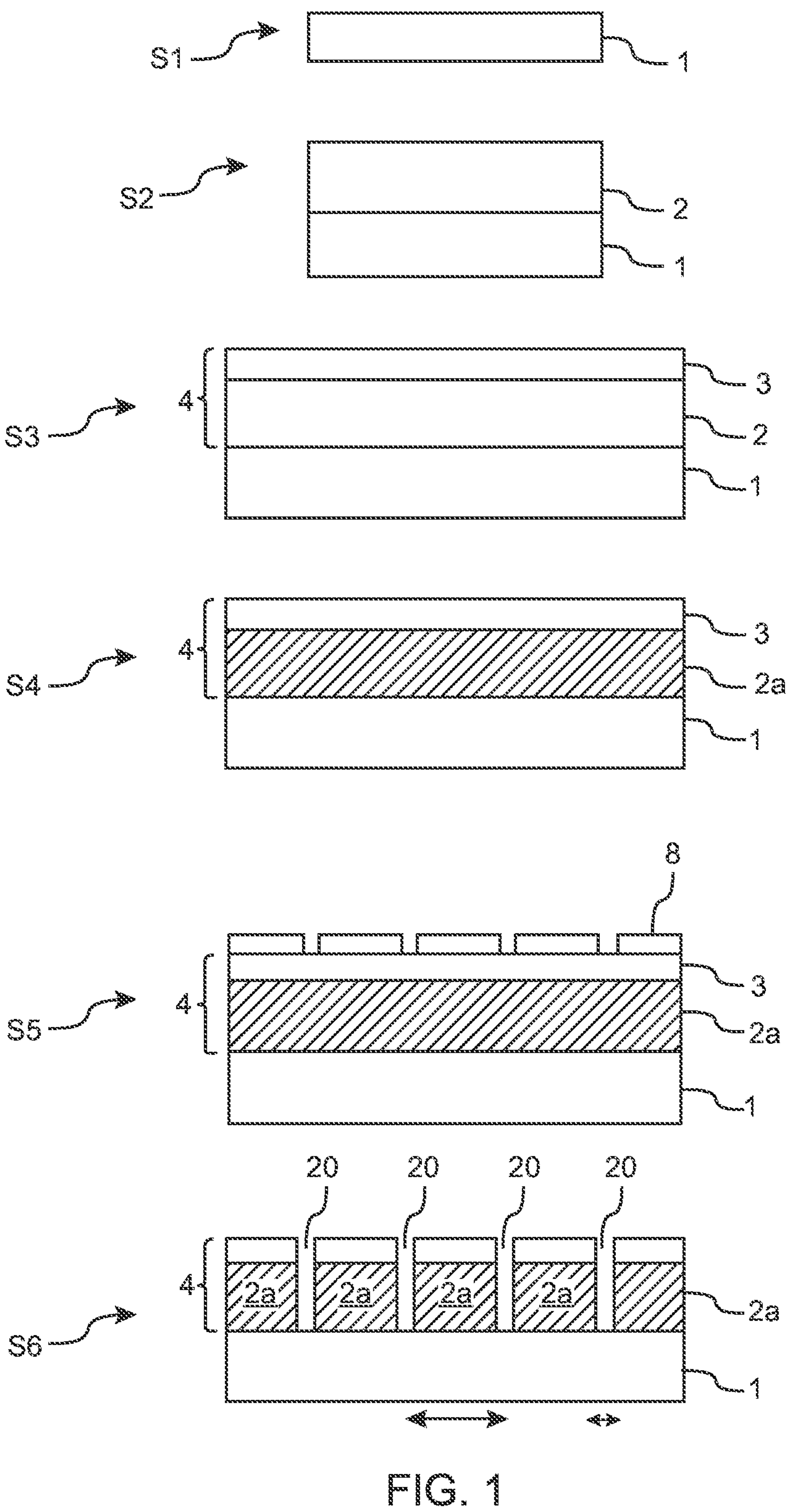
FIGS. 1 and 2 several steps of a method of manufacturing a functional semiconductor body, which realizes some aspects of the proposed principle.

The following embodiments and examples show various aspects and their combinations according to the proposed principle. The embodiments and examples are not always to scale. Likewise, various elements may be shown enlarged or reduced in size to highlight individual aspects. It will be understood that the individual aspects and features of the embodiments and examples shown in the figures may be readily combined with each other without affecting the principle of the invention. Some aspects have a regular structure or shape. It should be noted that minor deviations from the ideal shape may occur in practice, but without contradicting the inventive idea.

In addition, the individual figures, features and aspects are not necessarily shown in the correct size, nor do the proportions between the individual elements have to be fundamentally correct. Some aspects and features are highlighted by showing them enlarged. However, terms such as "above", "above", "below", "below", "larger", "smaller" and the like are correctly represented in relation to the elements in the figures. Thus, it is possible to derive such relationships between the elements based on the figures.

The inventors have recognized that the partial electrochemical decomposition (here called porosification) of a precisely defined GaN-containing layer causes a strong reduction of a holding force of a GaN epitaxial stack to the epitaxial substrate (sapphire or also Si, GaN) or also to other layers still to be grown. Thereby very uniform pores (in the range of 20 nm to 100 nm)—homogeneously distributed—are etched into the specific GaN layer. The selectivity of the "porosification" can be achieved by a high n-doping (Si) of the GaN layer. That is, only sufficiently highly doped layers are porosified. In addition to a reduced adhesion force, an improved relaxation is also achieved. This means that porosification also reduces a force between the porosified layer and still further layers to be grown. In the case of different lattice constants, porosification thus greatly reduces the tensions in the layer to be grown, so that it can grow up essentially without lattice defects. This effect can be exploited, on the one hand, by alternating porosified and non-porosified regions, thus creating localized strains. On the other hand, the effect of strain compensation can also be enhanced by introducing additional mesa structures with trenches that can relax when overgrown and thus contribute to a reduction of strains due to different lattice constants.

Due to the different lattice constant in the layer grown in this way, the indium content is incorporated with a different stoichiometric composition during epitaxial deposition of an indium-containing material, depending on the existing strain and thus the different lattice constant. Due to the now local change of the indium fraction in the material system, the band gap is changed. In addition to indium, this effect can also be achieved with Al or another material, which is incorporated with a stoichiometric change depending on the lattice constant and thus causes a change in the band gap.

Since a chemical etch attack takes place via the vertical through-material dislocation in the GaN epitaxial layer stack over the entire surface, a "porosification" can take place over the entire wafer. The layer to be porosified can be buried under other GaN or other material layers.

Alternatively, by partially passivating the surface during "porosification", a laterally selective etch attack can occur. By applying a mask, the buried areas in the first layer to be porosified below the masked surface areas are not or only slightly porosified, or etched, laterally in the plane, so that they have different chemical and mechanical properties in subsequent process steps. Optionally, an additional second layer can be inserted between the first layer to be porosified and the further layers forming the semiconductor device, so that this additional layer can serve as a mechanical breaking point in a further process step. In this way, depending on the application and design, different areas can have different degrees of porosity laterally or vertically.

Figure 2:
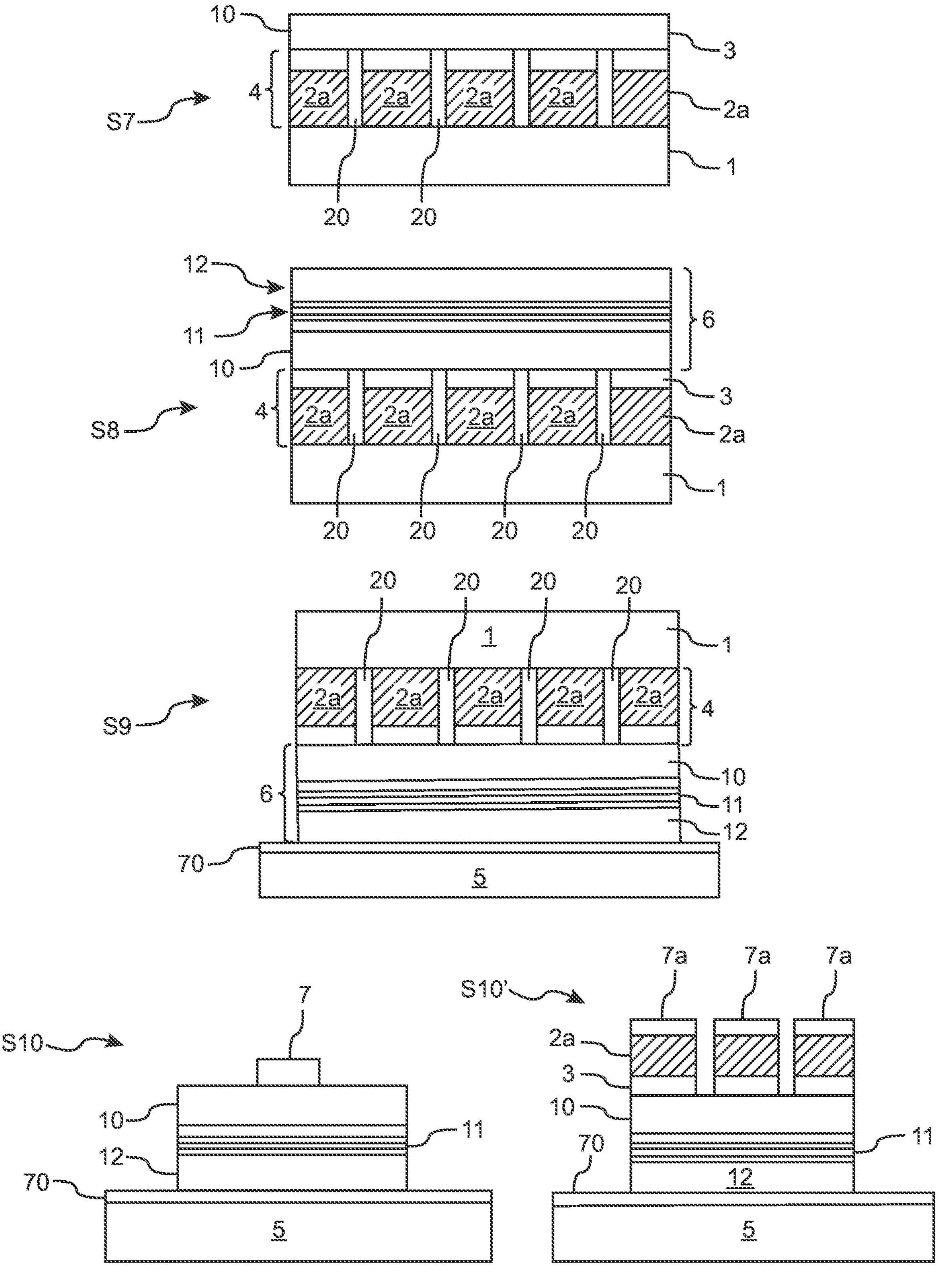

FIGS. 1 and 2 show an exemplary first embodiment of a method according to the proposed principle for producing a semiconductor body in which the lattice stresses are reduced, and which can be removed from a substrate particularly easily by means of a porous release layer.

For this purpose, in a first step S1, a carrier substrate 1 is provided as a subcarrier. In the present embodiments, this is a sapphire carrier substrate, but a carrier substrate with a different material system can also be used. For example, silicon-based carrier substrates, silicon nitride-based carrier substrates, or as shown sapphire-based carrier substrates are possible. In this case, the sub-substrate is also selected according to the material system that will be used later.

In a next step S2, a first layer 2 of the layer sequence 4 is deposited on the subcarrier 1. This first layer 2 is also provided with a dopant during the epitaxial deposition on the substrate of the subcarrier 1. The thickness of the layer is in the range between 500 nm and 3 μm, for example 1.5 μm. GaN or also AlInGaP or, as a further material system, AlGaAs can be used as the material, the latter for the production of red LEDs. In the present embodiment example, GaN is used as material for the first layer, which is epitaxially deposited on the subcarrier 1 with silicon Si as dopant. In this case, the dopant concentration of silicon atoms is in the range of $10\times10^{19}$ atoms/$cm^3$. In addition, one or more thin buffer layers in the range of less 10 nm to 100 nm can also be deposited on the material of the subcarrier 1 before the epitaxial growth of the GaN layer 2. These are not shown separately in step S2 but can be used for further planarization of the subcarrier 1. Furthermore, depending on the material system used, the additional buffer layers also serve as an etch stop or lattice matching structure or also as a current expansion layer for the subsequent electrochemical porosification process.

In a subsequent step S3, an undoped GaN layer 3 is deposited on the doped, epitaxially deposited GaN layer 2. Alternatively, AlInGaP can be used if layer 2 consists of doped AlGaAs or AlInGaP. The thickness of layer 3 is, for example, 100 nm (range from 20 nm to 150 nm) and, in terms of its dimension, is designed to be significantly thinner than the doped GaN layer 2. As a result, layer 3 also exhibits different mechanical, chemical and electrical properties compared with the latter. The undoped GaN layer 3 and the doped GaN layer 2 together form the layer sequence 4.

In step S4, the wafer thus produced is now subjected to an electrochemical stripping process. This is also referred to as the porosification process. For this purpose, a voltage is applied to the formed wafer structure and the layer sequence 4 so that a current flows through the undoped GaN layer 3 and the doped GaN layer 2. The current flow causes a partial chemical decomposition of the doped GaN layer. This process is called porosification. In this process, pores with a size in the range of a few 10 nm to 100 nm are uniformly etched in the doped GaN layer 2 by the electrochemical process. It was found that the distribution of the pores is essentially homogeneous and mainly perpendicular to the sapphire surface. The etch rate as well as the pore size and the associated material removal depend on the applied voltage, the current flow during the electrochemical process, the electrolyte used as well as a concentration of dopant atoms in the GaN layer 2. It should be noted that the undoped GaN layer 3 is also attacked by the electrochemical process. Material is removed from both layers, since they are not electrically insulating. However, the conductivity of the undoped GaN layer is significantly lower, so that selectivity during the porosification process is achieved by doping with silicon in layer 2.

In other words, the doped GaN layer 2 is attacked and etched much more strongly during the electrochemical process and thus material is dissolved out than is the case in the undoped GaN layer 3. Since the current in the present example is introduced over the entire surface of the wafer during porosification, the electrochemical process in the layer stack 4 follows over the entire surface. The thus porosified layer 2*a* in step S4 is thus buried under the undoped GaN layer 3.

The amount of material removed by the porosification process can be adjusted by the duration and the parameters described above. In order to ensure good subsequent removal by a laser lift-off or other mechanical process, the inventors propose a porosity level of at least 20% by volume. It was found that up to a porosity level of about 90 volume % to 95 volume %, the mechanical stability of the remaining material is nevertheless sufficient to allow further manufacturing steps. Nevertheless, due to the high material removal, an adhesion force between the substrate 1 and the porosified GaN layer 2*a* or between the latter and the undoped GaN layer 3 is strongly reduced. In this respect, a degree of porosity between 40 volume % and 90 volume % is therefore considered appropriate.

After porosification of the first layer 2 of the layer sequence 4, the wafer thus produced can be further processed to prepare it for the deposition of further layers having a different lattice constant. For this purpose, a patterned mask is applied to the undoped GaN layer 3 in step S5. In the embodiment example, this is designed as a plurality of strips in plan view. Here, a ratio of the width of the stripes to the distance between two adjacent stripes is about 10. In this embodiment, the distance between 2 stripes is in the range of 1 μm to 2 μm. Such a distance and a width of about 100 nm to 200 nm can still be produced lithographically with current technologies.

Subsequently, a selective etching process takes place in step S6, in which etching is performed through the undoped GaN layer, and the porosified layer to just before the subcarrier. In this way, a mesa structure with narrow but deep trenches is created. A ratio of depth to width of a trench is in the range of 5 to 14, and in particular in the range of 10. By a combination with the mesa-structured porosified layer, the structure produced in this way offers the special property that it can accommodate strains due to mismatched lattice constant. In other words, this layer is also suitable to be overgrown with a material system of different lattice constant without causing strains in it and thus defects in the crystal structure. Rather, the mesa-structured porous layer 2*a* strains, so that another layer can be grown in turn as a result without major strains. As a result, a layer grown on the mesa-structured porosified layer can be produced without major defects and essentially planar, and this can thus serve as a base layer for a functional semiconductor body or a functional semiconductor layer sequence.

The illustration of step S7 in FIG. 2 shows such a first step of a growth of an n-doped indium-containing layer 10, for example an InGaN layer, whose lattice constant is larger than the lattice constant of the layer sequence 4. The growth process of the n-doped InGaN layer 10 causes strains in the layer sequence 4, which are compensated by the porous regions 2*a* as well as the mesa structure in the layer sequence 4. As a result, the InGaN layer 10 grows up essentially defect and defect-free. In addition, material bridges are formed during the growth process, spanning the trenches 20. In other words, the InGaN material of the layer 10 thus grows only slightly into the trenches 20 essentially in the surface region of the undoped GaN layer 3 but does not fill these trenches.

This creates voids as shown in step S7, which can accommodate the crystal strains in the layer sequence 4. By varying the degree of porosity across layer 2*c* or further lithographic or epitaxial measures, a large degree of relaxation can be achieved in layer sequence 4 so that the defect density in layer 10 remains low. The grown layer 10 thus has an essentially planar and defect-free surface after the growth process, so that further layers of a functional semiconductor or a functional layer sequence 6 can be deposited on it with high quality. Step S8 shows the production of such a layer sequence 6, in which the layer is n-doped during the growth process.

Further layers 11 and 12 are deposited on this n-doped layer 10. The layer 11 forms a multiple quantum well for the emission of light of a defined wavelength. Layer 12 is formed by a p-doped GaN or a p-doped AlInGaP layer. The use of a GaN layer is particularly easy to implement. Alternatively, however, layer combinations e.g. of p-doped InGaN/AlGaN/GaN layers can also be formed. Thus, layer sequence 6 forms a device which, in operation, generates light of a defined wavelength when current flows through it. The wavelength is given by the band structure of the multiple quantum well, which in turn depends on possible strains in the underlying layer 10. Due to the low defect density and the essentially planar surface, the defect density of the multiple quantum well is also low in this example, so that a high radiative recombination rate can be achieved.

In step S9, the component or components thus produced are now applied from the subcarrier 1 to a final carrier substrate 5. For this purpose, the final carrier substrate 5 is covered with a metallization layer 70, which forms the p-contact for contacting the functional layer sequence 6. The p-doped layer 12 is attached to the metallization layer 70 by means of a solder. Subsequently, by means of a laser lift-off or other process, the subcarrier 1 is removed. Due to the porosification of the areas 2*a*, the adhesive force between the subcarrier 1 and the porosified areas 2*a* is greatly reduced in this process. This also reduces the energy input required for a laser lift-off process, so that only minor damage is formed in the surface.

In a further process step S10, remaining structures of the layer sequence 4 can be removed after a laser lift-off so that the planar layer 10 is exposed. A further metallized contact area 7 is applied to this layer, so that the resulting component is now designed as a vertical light-emitting diode. This structure is shown as a result for a single diode in step S10.

Alternatively, the mesa-structured and porous layer 2*a* may remain on the device and serve both for electrical contacting and as an outcoupling structure. Such an embodiment example is shown in step S10' of FIG. 2. Here, metallic contacts 7*a* are deposited on the porosified areas 2*a*. Since the porosified regions as well as the underlying layer 3 are conductive, current flow also occurs through the various layers 2*a*, 3, 10 and 12 in this example, so that recombination of charge carriers occurs in the multiple quantum well 11. In addition, the porosified regions 2*a* are used as the decoupling structure since they form a refractive index transition between the layer 3 and the air medium. Thus, in this embodiment example, additional roughening of the layer 10 or further decoupling structures and measures could be omitted.

Depending on the application, different variations of the proposed principle, i.e. a porosification of a first layer of a layer sequence, are now possible.

Figures 3A, 3B, 4:
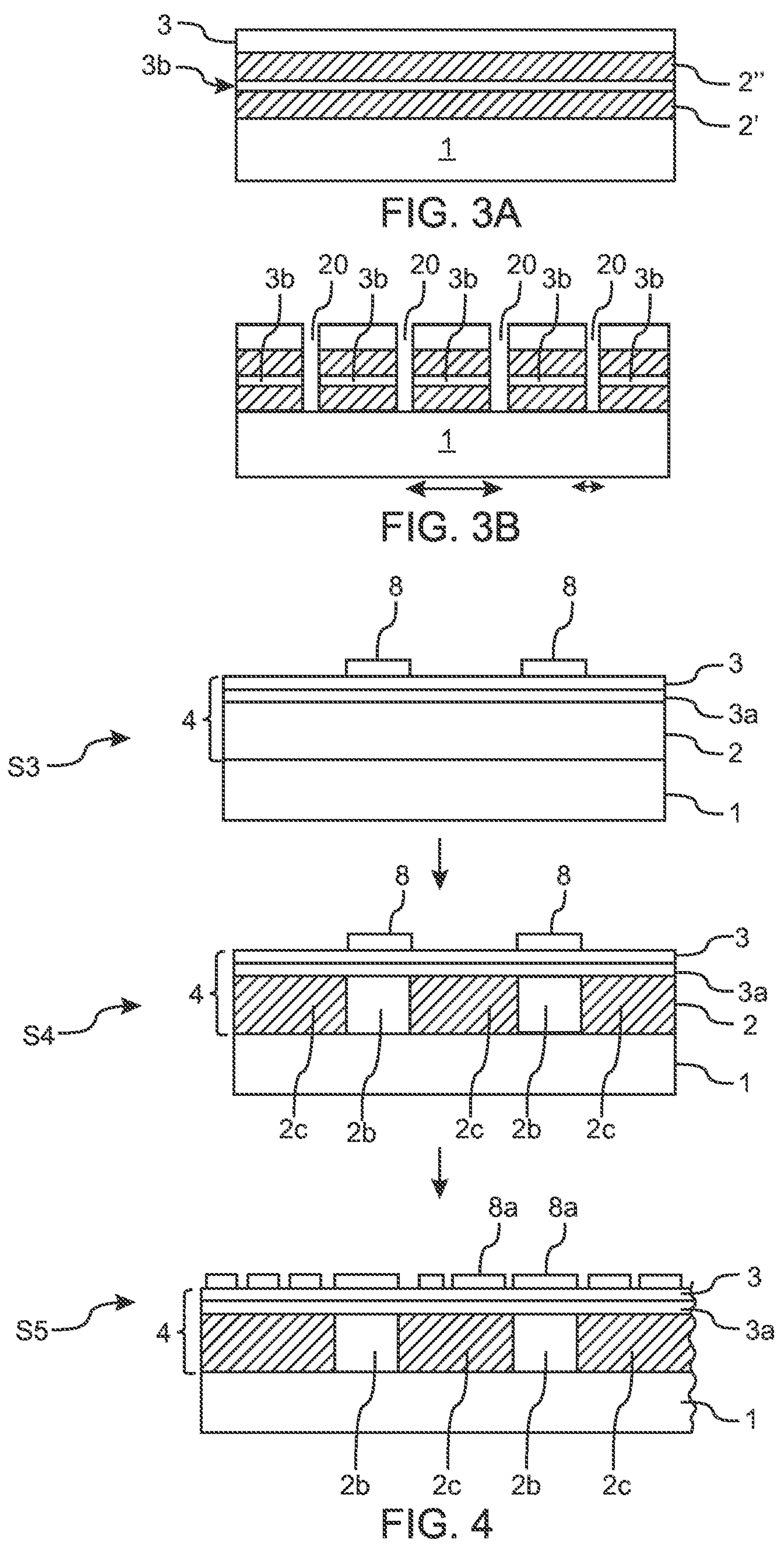
FIGS. 3A and 3B some aspects of another embodiment according to the proposed principle.
FIGS. 4 and 5 show another embodiment example with several method steps for the fabrication of a functional semiconductor body, which realize some aspects of the proposed principle.

FIG. 3A shows such an example, where differently doped regions are proposed to produce different degrees of porosity. FIG. 3A shows the result of the first steps of a manufacturing method of a semiconductor device. A first layer 2 has been deposited on a subcarrier 1, comprising a region 2' adjacent to the subcarrier 1 and a region 2". The regions 2' and 2" are separated from each other by a thin separation layer 3*b*. Separating layer 3*b* serves on the one hand as a predetermined breaking point and comprises, AlGaInN or silicon nitride, SiN, the latter for example as a monolayer. Furthermore, layer 3*b* separates different doping concentrations from each other. Thus, the doping level of the regions 2' and 2" is different, so that different porosity levels are also achieved with this during a subsequent electrochemical process. In the present embodiment example, the doping in region 2' is selected to be significantly higher than in region 2". As a result, significantly more material is removed and decomposed in region 2' during the electrochemical process than in region 2", which is closer to the undoped GaN layer 3.

For example, the structure thus formed is particularly suitable as an outcoupling structure. After forming a functional semiconductor body configured for light emission, the subcarrier is separated from the material 2' and the separation layer 3*b*. For this purpose, the predetermined breaking point 3*b* can also be removed in a further step, so that only the porosified region 2" of the first layer remains on the device. The degree of porosity of this porosified layer is selected so that layer 2" serves as an outcoupling structure, since its pore structure forms a suitable refractive index jump. Subsequent roughening by means of KOH or other measures is therefore unnecessary.

In FIG. 3B, the structure of FIG. 3A is shown after mesa structuring, such as that carried out in steps S5 and S6 in the previous example of FIG. 1. The etching process has penetrated the two subregions 2' and 2" as well as through the thin release layer 3*b* and extends to just before the submount 1. As in the previous example, the structure produced in this way can be overgrown with another material system of different lattice constant without causing distortions and defects in it.

Figure 5:
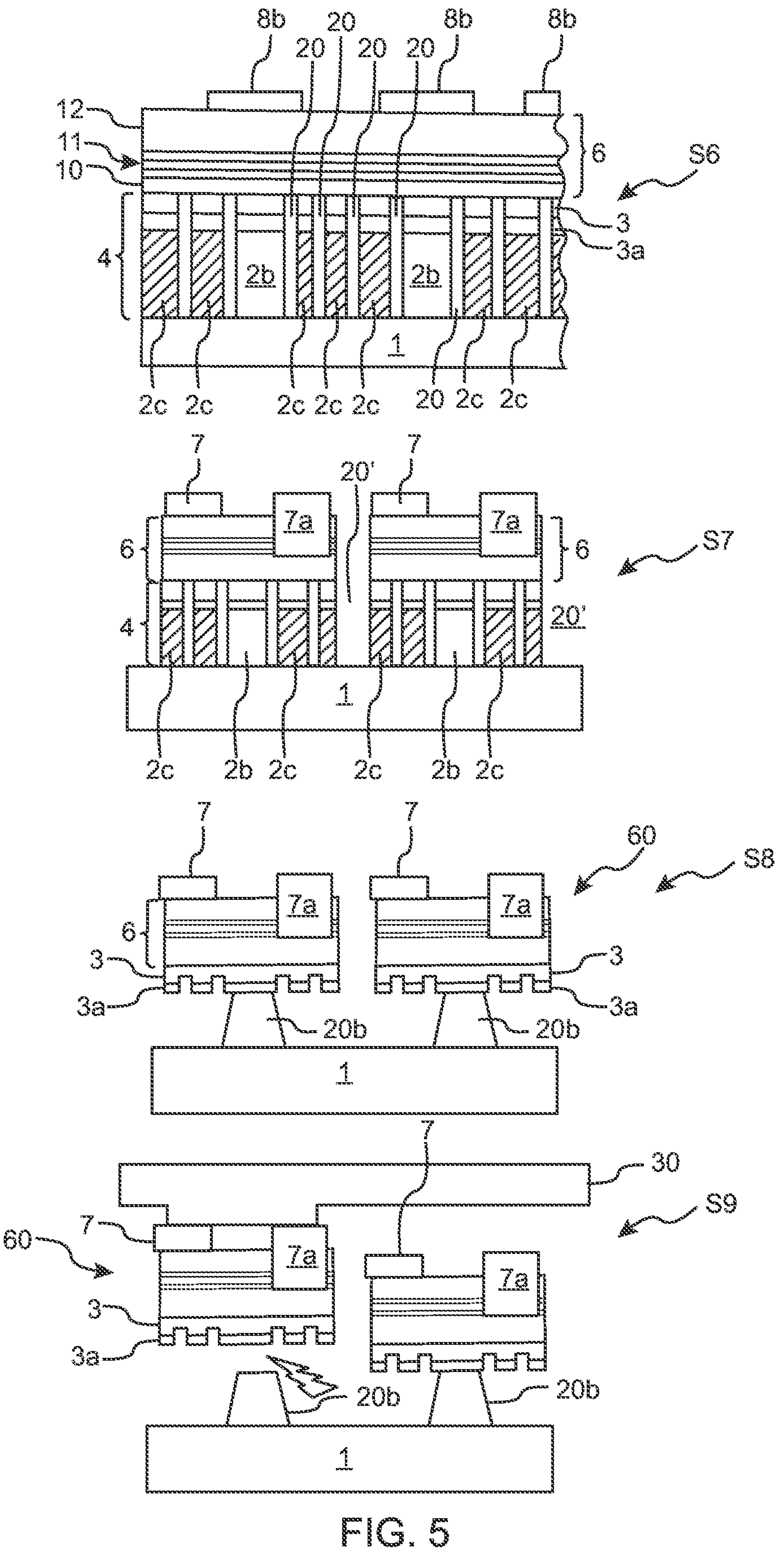

FIGS. 4 and 5 show various steps of a further embodiment of the proposed principle, in which additional measures and structuring of the layer sequence 4 are carried out before a mesa structure is formed. This allows further applications to be realized.

Steps S1 and S2 are the same as in the embodiment example of FIG. 1 or 2. Thus, after a subcarrier 1 has been provided, a doped GaN layer 2 is again epitaxially grown. A thin sol-breakup or sol-separation layer 3*a* is now deposited on the doped GaN layer 2. This can be formed, for example, from AlGaInN or also from intrinsic silicon nitride, for example a monolayer of SiN, and in the present embodiment also extends over the entire wafer. The undoped GaN layer 3 is again deposited epitaxially over the thin predetermined breaking layer 3*a*. The resulting layer sequence 4 on the carrier substrate 1 is shown in FIG. 4 in step S3.

In step S3, a patterned mask 8 is now further deposited on the undoped GaN layer 3, for example on 2 sites. The mask 8 is chemically inert to the following electrochemical porosification step and is listed as a hard mask, for example. As shown in step S4, after the structured mask 8 is applied, the electrochemical porosification is performed. In this process, however, the structure of the mask 8 acts as shading, so that areas below the mask 8 in the first layer 2*a* are precisely not porosified or etched but remain as non-porosified areas 2*b*. In the example of steps S3 and S4 of FIG. 4, these are 2 areas that are a few μm wide and essentially form squares in plan view. However, other dimensions and or a different number of such areas may be provided. Likewise, the shape can be different, for example as polygons or also as circles or rectangles.

The background for such selective pore-solubilization is the fact that current flow is largely prevented by layer 3, layer 3*a* and first layer 2 due to the insulating behavior of mask 8. In other words, current always seeks the path of least resistance (and thus usually the shortest path if resistivity is constant) and therefore would not flow below the areas covered or shaded by mask 8 during the electrochemical process. As a result, porosification due to current flow occurs mainly in the unshaded regions of the first layer, so that porosified regions 2*c* are formed there. Likewise, penetration of an electrolyte under the shadowed areas during the electrochemical etching process is impeded or also prevented, so that no further etching channels can form there, or existing channels are not widened by the electrolyte.

The dimension of the mask 8 is adapted to the dimension of the later non-porous area 2*b*. Although the sheet resistance is greater below the mask and the current flow is significantly smaller there, slight under-etching takes place within a small range in the edge region. Due to the under-etching during the electrochemical porosification, it is advisable to make the resist mask 8 somewhat larger in dimension than the later non-porosified area should be. This compensates for a slight under-etching below the mask and thus into the shadowed area. For nitrides, this under-etching can be in the range of 200 nm to about 800 nm; for materials based on GaAs or GaP, the under-etching can be larger than 1000 nm. The dimension and lateral extent must be chosen accordingly.

In the subsequent method step S5, mask 8 is removed again and instead mask 8*a* is applied to the surface of layer 3 to create the mesa structure.

The mask is designed in such a way that parts of the non-porous areas 2*b* are covered by the mask structure. Only at the edges between the porosified areas and the non-porosified areas of layer 2 are recesses provided in the mask. In addition, a mask structure is also arranged over the remaining modified areas 2*c*, which has recesses at periodic intervals. Thus, a mask structure 8*a* is created, with the aid of which the mesa structure described in the previous examples can be etched.

Method step S6 of FIG. 5 shows the result after such a selective etching process in which trenches 20 are etched into the layer sequence 4 at regular intervals. In particular, two trenches 20 are provided adjacent to each of the non-porous areas, so that one trench 20 separates a porous area 2*c* from a non-porous area 2*b*.

The AlInGaN layer 10 is then applied to the structure produced in this way. As in the previous examples, this is p-doped, n-doped or undoped, depending on the application and the desired design of the component. The additional mesa structures reduce stress in the layer 10 so that it grows as defect-free and planar as possible. A multiple quantum well 11 is deposited on the grown layer 10, which is followed by a layer 12 that continues to be doped. The layers 10, 11 and 12 form the layer sequence 6 of the functional semiconductor layer sequence. Subsequently, a patterned mask 8*b* is arranged on the deposited layer 12. Thereby, mask components cover the non-porous regions 2*b* and the adjacent trenches 20 as well as a part of the adjacent porous regions 2*c*. Parts of the surface of layer 12 continue to be exposed between the individual masks 8*b*.

In a subsequent selective etching process, shown in step S7 of FIG. 5, the free areas of layer 12 as well as the underlying areas of the multiple quantum well structure 11 of layer 10 and the layer sequence 4 are etched. This divides the semiconductor layer sequence into individual functional devices. The etching trench 20' extends from the surface of the semiconductor layer sequence 6 to approximately the substrate 1. After such an etching step, contact regions 7A and 7 are further provided in the respective devices. Here, the contact region 7*a* is electrically isolated from the layer 12 as well as from the multiple quantum well 11 and contacts the doped buried layer 10. The contact region 7 directly electrically connects the layer 12.

Through the trenches 20' created by the selective etching process, the porosified areas 2*c* can be reached and removed by a wet chemical and selective etching process. As a result, the columnar structures 20*b* of non-porosified material shown in method step S8 are left standing, thus forming a support structure for the devices located thereon. The selective process also slightly roughens layer 3*a* as well as layer 3 so that they can serve as an outcoupling structure for the light generated in the multiple quantum well. These pillars can take different shapes depending on the design. In some aspects, the holding structure can form a truncated cone, truncated pyramid, or trapezoid, with the smaller base of this body connected to the device. In other words, the diameter decreases away from the building element. This decrease in diameter, or more generally a change in diameter, is achieved by varying doping during epitaxial deposition of the first layer. Among other things, the doping also controls the rate of porous solubilization, so that the undercutting below the shadowed regions is also influenced.

In one or more further method steps, shown in FIG. 5 in step S9, an stamp pad 30 is selectively applied to the functional semiconductor body 60 and then a mechanical process or laser lift-off process is used to separate the functional semiconductor body from the pillar and support structure 20*b*. Semiconductor body 60 now adheres to the stamp pad 30 and can be transferred for further process control or processing. The remaining depressions in the layer 3*a* or 3 caused by the patterning can serve as a further decoupling structure or can also be filled with a suitable material.

For the production of a mesa structure to reduce possible tension of layers grown on it, different prerequisites may be necessary or have to be observed, depending on the material system.

On the one hand, the height of the layer to be porosified later and thus also the height of the trenches should not exceed a few micrometers, so that still sufficient stress compensation is ensured. In addition, if the ratio between depth and trench width were too great, a trench would not be able to be etched uniformly, so that instead of an essentially rectangular course as shown in the cross-section diagram, a triangular depression would form in cross-section. A height of the layer 2 to be porosified corresponding to the previous examples should therefore be approximately 1 μm to 2 μm, possibly only 500 nm.

With a width of the same order of magnitude as the height of layer 2, for example shown in step S6 of FIG. 1, the width of the trenches can be selected to be approximately ten times smaller than the width of the respective section of layer 2 to be porosified. This results in the square cross-sectional area shown in step S6 of FIG. 1. In general, the trenches should be as narrow as possible, but sufficiently large to ensure relaxation, i.e. stress compensation, of the stressed layer applied to the layer sequence 4.

The various etching and masking steps are achieved by different lithography processes. Here, for the formation of the mesa structure, a wet-chemical, but also a dry-chemical etching process to layer 2*a* can be realized.

Figure 6:
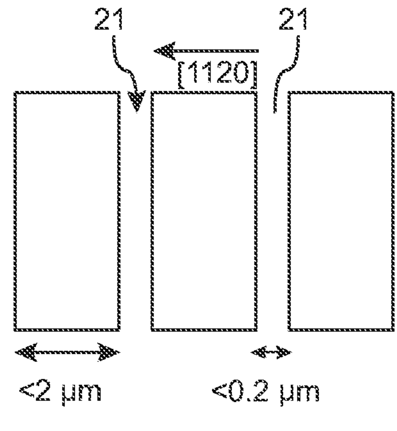
FIG. 6 an embodiment of a possible mesa structure for a material system with wurtzite structure.
Figure 7:
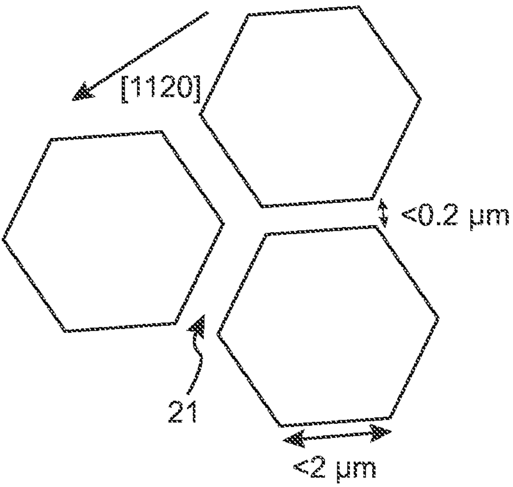
FIG. 7 a further embodiment of a possible mesa structure for a material system with wurtzite structure.

FIGS. 6 and 7 show different geometries for such a mesa structure in plan view. Depending on the material system, it is necessary to form the mesa structures along a given axis or a given orientation. In FIGS. 6 and 7, this is illustrated using a wurtzite structure for nitrite-based material systems. In a wurtzite structure, it is convenient to orient the coalescence surfaces 21 so that they are essentially perpendicular to the a-axis [1120]. In this way, the trenches of the mesa structure are also etched parallel to the coalescence surfaces, and the structures shown in FIG. 6, for example, are formed.

Another embodiment, in which mesa structures are designed as periodic hexagons, is shown in FIG. 7, in which the trenches and the coalescence surfaces 21 are designed to form polygons and, in particular, a hexagonal structure. As shown, the edge length of this hexagonal structure is less than 2 μm, and the width of a trench is essentially one tenth less, i.e. in the range of 200 nm or less.

Figures 8, 9:
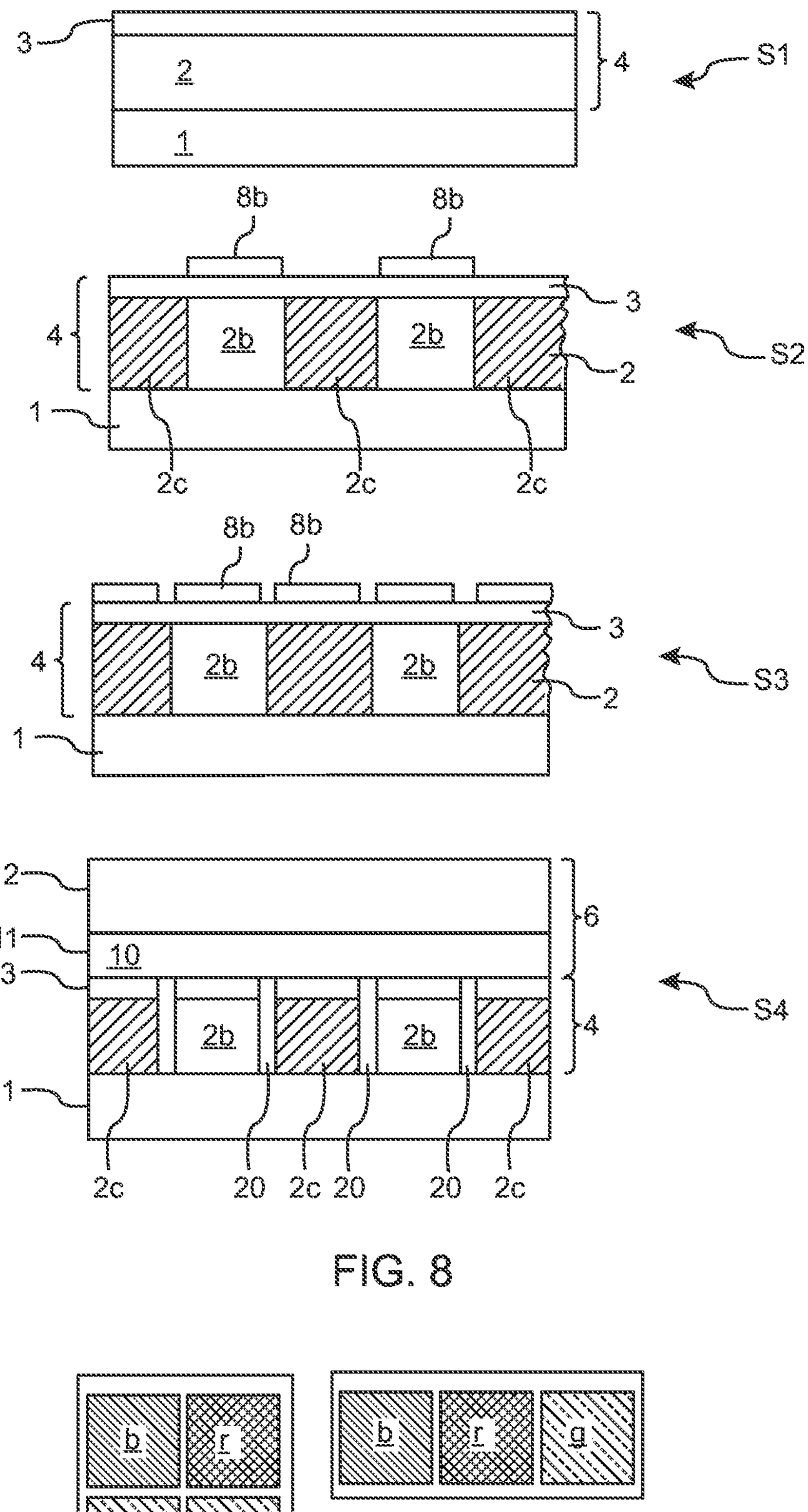
FIG. 8 shows another embodiment example with some method steps for the fabrication of a functional semiconductor body, which realize some aspects of the proposed principle.
FIG. 9 shows two top views of emission surfaces of optoelectronic components which can be manufactured by the method according to FIG. 8.

FIG. 8 shows a further example of an embodiment as well as an application case in which porous regions and non-porous regions are used to produce a light-emitting semiconductor body, whereby this emits light of different wavelengths. In the first method step shown, as already explained in the previous examples, a subcarrier 1 is provided onto which a doped GaN layer 2 is deposited. On this, in turn, an undoped layer of the same material system is deposited, resulting in the layer sequence 4 shown in method step S1.

In subsequent method steps, a mask structure 8 is first deposited on the surface of the undoped GaN layer 3. The structure thus obtained is then subjected to an electrochemical detachment and porosification process, so that primarily non-shaded areas of the doped layer 2 are porosified. In the areas where the mask 8 covers the layer 2, no dedicated porosification takes place due to the reduced or non-existent current flow as explained above, so that these areas are essentially left with continuous material of doped GaN. As a result, no subsequent reduction in strain due to porosification is expected in regions 2*b*.

In a further method step shown in S3 of FIG. 8, the mask 8 is now removed and the mask 8*b* is again applied to the layer 3. Here, however, the mask structuring is carried out in such a way that part of the mask 8*b* is arranged over the non-porosified areas 2*b*. Similarly, mask sections are deposited over the porous areas 2*c*. It is provided that a small part is left open between the individual mask sections so that the layer 3 underneath is exposed. The position of this exposed portion is chosen so that it is essentially along the interface between the porous solubilized areas 2*c* and the non-porous solubilized areas 2*b*, respectively. Then, again, a selective etching process can be carried out to create trenches at the interfaces between the areas 2*b* and 2*c* down to the submount 1. In this way, a structuring is carried out which separates the porosified areas 2*c* from the non-porosified areas 2*b* by means of a trench.

Subsequently, the mesa structure thus contained is overgrown with an indium-containing layer, in the embodiment with a GaN layer 10, see step S4 in FIG. 8. As in the previous examples, the InGaN layer forms bridges between the individual trenches 20 so that the trenches essentially remain as voids and are not overgrown. However, the InGaN material can at least partially enter the trenches at the top between the undoped layer 3.

Due to the non-porous regions 2*b*, the deposited material of the layer 10 is strained over these regions, which is noticeable in a change and strain of the lattice structure. Whether this tension now leads to additional lattice defects depends on the design of the dimensioning as well as the difference of the two lattice constants between the doped InGaN layer 10 and the undoped layer 3.

In further deposition processes, the layer 12 with another contained multiple quantum well is now deposited on the layer 10. In this process, the layer 12 comprises AlInGaN, which is doped or also provided with a doping gradient, depending on the embodiment. Due to the strains introduced by the non-porous regions 2*b*, the band structure and thus the band gap of the multiple quantum well 11 changes. This is caused by the strains continuing through the layer 10 and extending into the layer 12 and the multiple quantum well 11. For this purpose, it is necessary to make the in InGaN layer 10 as thin as possible, but planar, in order to guide the strains through the layer 10 into the layer 11. As a result, the strains thus lead to an emission of light of different wavelengths. It was achieved that a wide range of possible wavelengths can be reached by a suitable choice of the strain and the material system.

A top view of an electronic component manufactured in this way is shown in various alternative embodiments in FIG. 9. The emission surfaces can be seen, with the multiple quantum well and any porosified areas of varying degrees of porosity beneath them. By suitable porosification and insertion of a mesa structure, different strains can be generated in the material arranged above. The different bandgaps resulting from the tensions due to a changed indium content now cause an emission of light with different wavelengths. In this way, in a suitable material system, for example the above-mentioned AlInGaN, light emission in the blue, green and red range can be achieved through the strain.

In the left partial figure of FIG. 9, the region b in the upper left corner shows the greatest strains, for example a non-porous layer 2*b* is arranged there. The region r, in turn, is much less strained, so that the multiple quantum well emits essentially red light there as a result. The two lower regions g are provided with a degree of porosity that lies between the blue and red regions b, r, so that the multiple quantum well is slightly strained here and thus emits light in the green range. Alternatively, such a pixel with a blue, red and green emitter area may be arranged side by side. Such an embodiment is shown in the right part of FIG. 9, in which areas with different degrees of porosity are designed to generate light in the blue, red and green spectrum.

For example, to create a different degree of porosity, it is intended to selectively remove the individual masks 8 as shown in step S2 of FIG. 8 above and then continue the electrochemical porosification process. For example, to create a different degree of porosity to form a blue, red and green emitter area, a shadow mask 8 can be applied to the later blue and green emitter area. The red surface remains free.

Subsequently, a first electrochemical detachment process is carried out and a first porosification is generated for the red emitter area. Then this electrochemical detachment process is stopped, the mask over the green area is removed, and then the electrochemical detachment process is continued. Correspondingly, the red and green areas (or layer 2, which is later under the multiple quantum well) are now further porosified. Thus, a different degree of porosity can be achieved in the respective surfaces. Alternatively, as in FIGS. 3A and 3B, for example, additional layers can be provided to create differences in porosification and thus be used to form the differently colored areas.

The invention claimed is:

1. A semiconductor device comprising:

a subcarrier;

a layer sequence comprising a first layer having a doped semiconductor material and a second layer deposited thereon, the second layer comprising an undoped semiconductor material, wherein the first layer comprises at least one porous region, wherein a porosity level of the at least one porous region is at least 20% by volume;

a mesa structure introduced in the first and second layers and comprising several depressions; and a functional layer sequence comprising at least one planar third layer deposited on the second layer and spanning the mesa structure, wherein the at least one planar third layer has a lattice constant which is different from a lattice constant of the second layer.

2. The semiconductor device according to claim 1, wherein a width of a depression is about ⅕ to 1/20 of a distance between two adjacent depressions.

3. The semiconductor device according to claim 1, wherein the first layer comprises at least one non-porous region at least partially surrounded by a porous region.

4. The semiconductor device according to claim 3, wherein the at least one non-porous region is separated from the porous region by a trench forming the mesa structure.

5. The semiconductor device according to claim 1, wherein the functional layer sequence comprises a multiple quantum well structure arranged on the at least one planar third layer.

6. The semiconductor device according to claim 5, wherein a first region of the multiple quantum well structure overlying a porous region of the first layer is configured to emit light of a first wavelength and a second region of the multiple quantum well structure overlying a non-porous region of the first layer is configured to emit light of a second shorter wavelength.

7. The semiconductor device according to claim 1, wherein the first layer comprises a first sub-region having a first degree of porosity and a second sub-region having a second degree of porosity, the first sub-region being separated from the second sub-region by an optional separation layer.

8. The semiconductor device according to claim 1, wherein the first layer comprises n-doping and the second layer is undoped, the first and second layers comprising the same base material.

9. The semiconductor device according to claim 1, wherein the second layer comprises an undoped GaN layer and the third layer comprises InGaN with an indium content in a range of 0.0001% to 25%.

* * * * *